(12) United States Patent
Park et al.

(10) Patent No.: US 9,165,614 B2
(45) Date of Patent: Oct. 20, 2015

(54) MEMORY AND MEMORY SYSTEM

(71) Applicant: SK hynix Inc., Gyeonggi-do (KR)

(72) Inventors: Heat-Bit Park, Gyeonggi-do (KR);
Kang-Seol Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/049,878

(22) Filed: Oct. 9, 2013

(65) Prior Publication Data

US 2014/0355364 A1    Dec. 4, 2014

(30) Foreign Application Priority Data

May 31, 2013 (KR) .................. 10-2013-0062409

(51) Int. Cl.
*G11C 8/00* (2006.01)
*G11C 7/10* (2006.01)
*G11C 8/12* (2006.01)
*G11C 5/02* (2006.01)

(52) U.S. Cl.
CPC *G11C 7/10* (2013.01); *G11C 5/025* (2013.01); *G11C 7/106* (2013.01); *G11C 7/1087* (2013.01); *G11C 8/12* (2013.01); *G11C 2207/107* (2013.01)

(58) Field of Classification Search
CPC ........ G11C 8/12; G11C 29/1201; G11C 7/10; G11C 5/025; G11C 5/04; G11C 5/06; G11C 11/4096; G11C 11/4093; G11C 2207/107
USPC .................. 365/230.03, 51, 63, 219–221
See application file for complete search history.

(56) References Cited

U.S. PATENT DOCUMENTS 7,196,962 B2 *   3/2007   Lee .................. 365/230.05
7,965,531 B2 *   6/2011   Matsui et al. ............. 365/51

FOREIGN PATENT DOCUMENTS

KR    1020050022855    3/2005
KR    1020110099384    9/2011

* cited by examiner

*Primary Examiner* — David Lam
(74) *Attorney, Agent, or Firm* — IP & T Group LLP

(57) ABSTRACT

A memory may include first to $N^{th}$ cell arrays configured to include a plurality of memory cells and one or more first to $N^{th}$ data input/output pads respectively corresponding to the first to $N^{th}$ cell arrays, wherein the one or more first to $N^{th}$ data input/output pads are configured to input/output data to/from the first to $N^{th}$ cell arrays.

13 Claims, 7 Drawing Sheets

MEMORY AND MEMORY SYSTEM

CROSS-REFERENCE TO RELATED APPLICATIONS

The present application claims priority of Korean Patent Application No. 10-2013-0062409, filed on May 31, 2013, which is incorporated herein by reference in its entirety.

BACKGROUND

1. Field

Exemplary implementations of the present invention relate to a memory and a memory system that can reduce the loading of through vias and lines transferring data and reduce the skewness of data inputted to/outputted from a data input/output pad.

2. Description of the Related Art

A memory may include a plurality of cell arrays in which a plurality of memory cells are disposed in an array. One or more of such cell arrays may form a bank. A memory may also include a plurality of data input/output pads to input/output data to/from a bank selected from among a plurality of banks.

FIG. 1 is block diagram illustrating a configuration of a conventional memory.

As shown in FIG. 1, a memory may include a plurality of banks BK1 to BK8, a plurality of data input/output pads PAD1 to PAD8, a data input circuit IN_CIR, and a data output circuit OUT_CIR.

The operation of the conventional memory will be described with reference to FIG. 1.

In the following description, a case where, whenever a command accompanied with input/output of data is inputted, eight pieces of data are inputted to/outputted from each of the plurality of data input/output pads PAD1 to PAD8 will be described (that is to say, whenever a command accompanied with input/output of data is inputted, 64 pieces of data are inputted to/outputted from the memory).

(1) Data Input Operation (Write Operation)

Data DATA is inputted through the plurality data input/output pads PAD1 to PAD8, together with an address ADD and a write command WT accompanied with input of data DATA. In this case, eight pieces of data are serially inputted to each data input/output pad. The 64 pieces of data inputted to the plurality of data input/output pads PAD1 to PAD8 are serial-to-parallel converted in the data input circuit IN_CIR. The 64 pieces are then are loaded on a global bus GIO_BUS to be transferred to a bank, from among the plurality of banks BK1 to BK8, selected by the address. The bank, from among the plurality of banks BK1 to BK8, selected by the address may generate one or more selection signals YI to select memory cells, from among a plurality of memory cells, in which data DATA received through the global bus GIO_BUS is to be stored using the address ADD, and may write the data DATA in the memory cells selected by the selection signals YI.

(2) Data Output Operation (Read Operation)

When the read command RD is applied, then a bank, from among the plurality of banks BK1 to BK8, selected in response to the address ADD may generate a selection signal YI for selecting memory cells, from among a plurality of memory cells, to which data is to be outputted. Data of the memory cells selected by the selection signal YI may be read and loaded on the global bus GIO_BUS. The data on the global bus GIO_BUS may be transferred to the data output circuit OUT_CIR, may be parallel-to-serial converted, and then may be outputted to the outside of the memory through the plurality of data input/output pads PAD1 to PAD8.

In the memory, the plurality of data input/output pads PAD1 to PAD8 are congregated in a specific position (e.g. the pads are congregated in the left portion of the memory in the case of FIG. 1). Therefore, in order to transfer data from the plurality of data input/output pads PAD1 to PAD8 to a bank selected from among the plurality of banks BK1 to BK8, or to transfer data outputted from a selected bank to the plurality of data input/output pads PAD1 to PAD8, the length of the global bus GIO_BUS for transferring data is long and the loading thereof is great.

SUMMARY

An exemplary memory may include first to $N^{th}$ cell arrays configured to include a plurality of memory cells; and one or more first to $N^{th}$ data input/output pads respectively corresponding to the first to $N^{th}$ cell arrays, wherein the one or more first to $N^{th}$ data input/output pads are configured to input/output data to/from the first to $N^{th}$ cell arrays.

An exemplary memory may include a first cell array including a first plurality of memory cells; a second cell array including a second plurality of memory cells; one or more first data input/output pads respectively corresponding to the first cell array, wherein the one or more first data input/output pads are configured to input/output data to/from the first cell array; and one or more second data input/output pads respectively corresponding to the second cell array, wherein the one or more first data input/output pads are configured to input/output data to/from the second cell array.

An exemplary memory system may include a first memory chip including first to $N^{th}$ cell arrays, each including a plurality of memory cells; a second memory chip, stacked on the first memory chip, including first to $N^{th}$ cell arrays, each including a plurality of memory cells, and to be stacked on the first memory chip; and one or more first to $N^{th}$ data input/output pads respectively corresponding to the first to $N^{th}$ cell arrays of the first memory chip and to the first to $N^{th}$ cell arrays of the second memory chip, wherein the one or more first to $N^{th}$ data input/output pads are configured to input/output data to/from the first to $N^{th}$ cell arrays of the first memory chip and to the first to $N^{th}$ cell arrays of the second memory chip.

DETAILED DESCRIPTION

Figure 1:
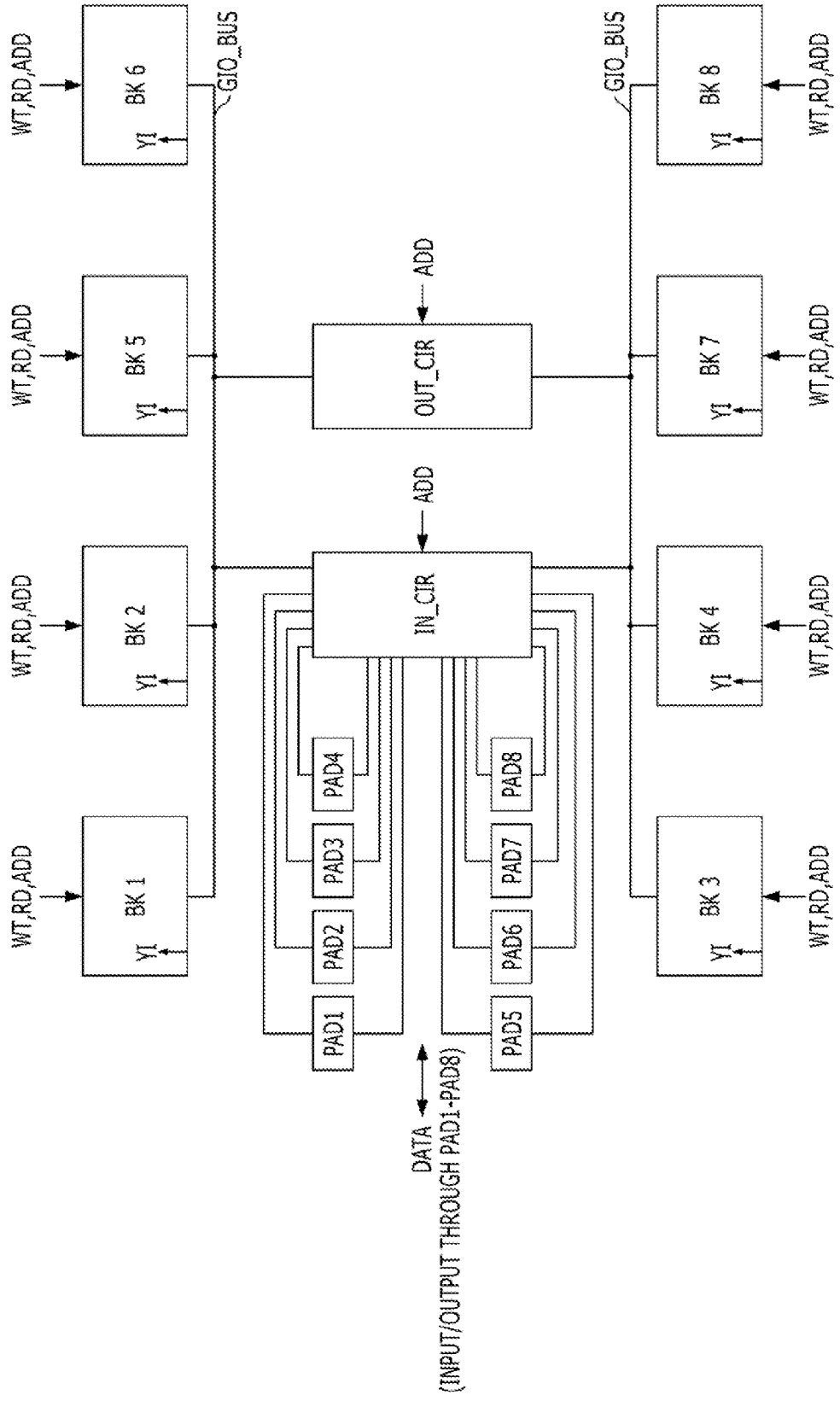
FIG. 1 is a view illustrating a configuration of a conventional memory.

Various implementations will be described below in more detail with reference to the accompanying drawings. The present invention may, however, be embodied in different forms and should not be construed as limited to the implementations set forth herein. Rather, these implementations are provided so that this disclosure will be thorough and complete, and will fully convey the scope of the present invention to those skilled in the art. Throughout the disclosure, like reference numerals refer to like parts throughout the various figures and implementations of the present invention.

The drawings are not necessarily to scale and in some instances, proportions may have been exaggerated in order to clearly illustrate features of the implementations. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
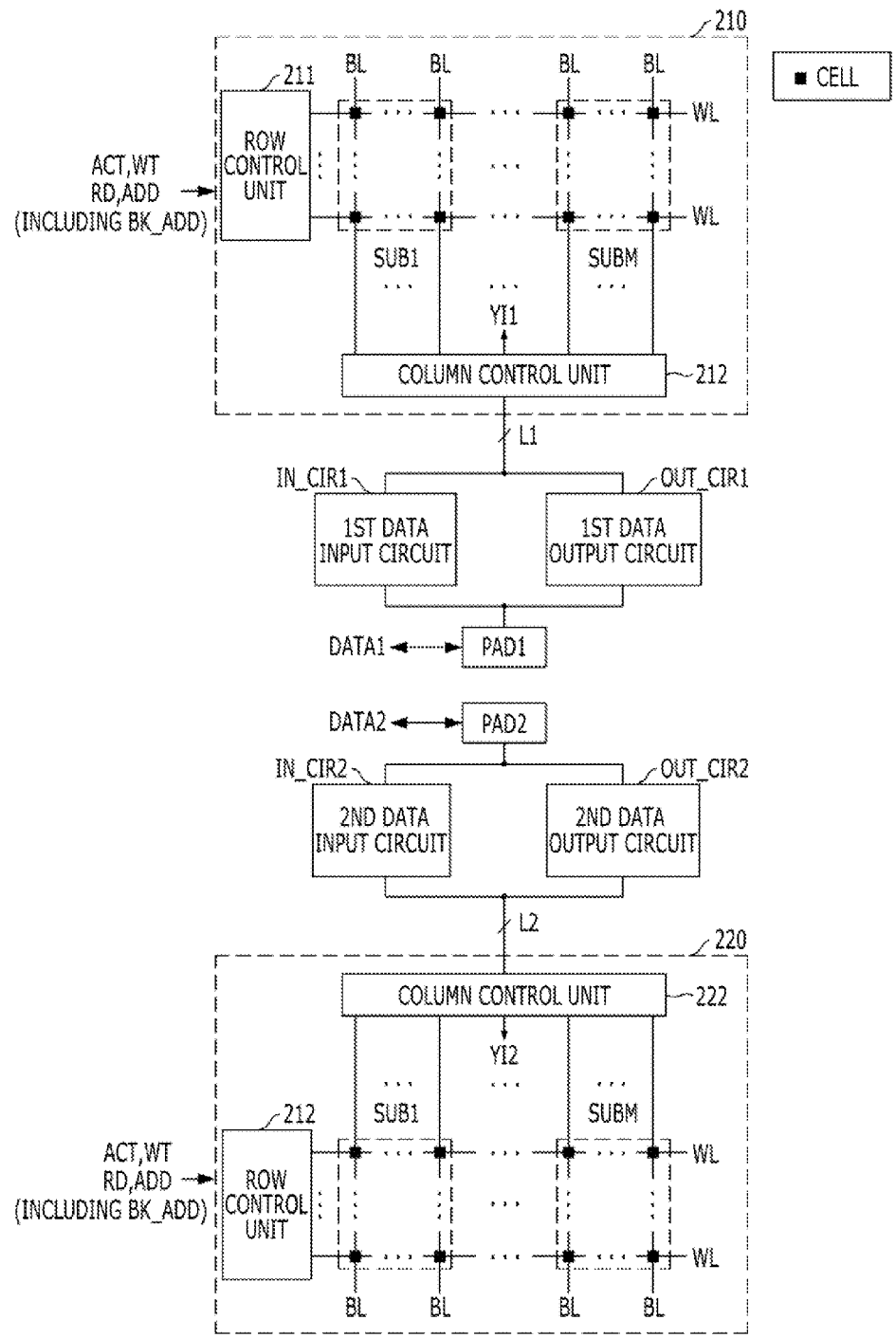
FIG. 2 is a view illustrating the configuration of a memory according to one implementation of the present invention.

FIG. 2 is a view illustrating the configuration of a memory according to one implementation of the present invention.

As shown in FIG. 2, a memory may include a first cell array 210 and a second cell array 220. The first cell array 210 and the second cell array 220 may include a plurality of memory cells CELL. One or more first data input/output pads PAD1 may input/output data to/from the first cell array 210. One or more second data input/output pads PAD2 configured to correspond to the second cell array 220 may input/output data to/from the second cell array 220. In addition, the memory may include a first row control unit 211 and a first column control unit 212 to control an input/output of data to/from the plurality of memory cells CELL of the first cell array 210, and may include a second row unit 221 and a second column control unit 222 to control an input/output of data of the plurality of memory cells CELL of the second cell array 220. The input/output of data by a first row control unit 211, the first column control unit 212, the second row unit 221, and the second column control unit 222, may be based on commands ACT, WT, or RD, or on an address ADD. The one or more first data input/output pads PAD1 are disposed adjacent to the first cell array 210, and the one or more second data input/output pads PAD2 are disposed adjacent to the second cell array 220. FIG. 2 illustrates an example where only one first data input/output pad PAD1 and one second data input/output pad PAD2 exist.

The address ADD may include a row address to select one or more word lines from among a plurality of word lines WL, and a column address for selecting one or more bit lines from among a plurality of bit lines BL.

The operation of the memory will be described with reference to FIG. 2.

If a write command WT, accompanied with input of data, is received by the memory, then the memory may write data DATA1 and DATA2, which are respectively inputted through the data input/output pads PAD1 and PAD2, in memory cells selected by an address ADD. If a read command RD, accompanied with output of data, is received by the memory, then the memory may output data DATA1 and DATA2, of memory cells selected by an address ADD, to a respective one or more of the data input/output pads PAD1 and PAD2. Generally, the write command WT and the read command RD are inputted after an active command ACT for activating the word lines WL is inputted.

The first cell array 210 may include first to $M^{th}$ sub-cell arrays SUB1 to SUBM, each of which may include a plurality of memory cells CELL. Here, the first to $M^{th}$ sub-cell arrays SUB1 to SUBM may correspond to banks that are identified by a bank address BK_ADD that included in the address ADD. The plurality of memory cells CELL included in the first cell array 210 are coupled to the plurality of word lines WL and the plurality of bit lines BL.

The first row control unit 211 may activate one or more word lines WL, from among the plurality of word lines WL, that correspond to the address ADD, in response to an active command ACT. The first column control unit 212 may generate, in response to a write command WT or a read command RD, a first selection signal YI1 to select one or more bit lines BL corresponding to the address ADD, and may transfer the data DATA1 between a plurality of first data lines L1 and one or more bit lines BL selected by the first selection signal YI1.

A first data input circuit IN_CIR1 may communicate with the first cell array 210 and the first data input/output pad PAD1, and may parallel-arrange and input data DATA1, inputted from the first data input/output pad PAD1, to the first cell array 210, during a data input operation. The first data input circuit IN_CIR1 may serial-to-parallel convert data DATA1, inputted in series, through the first data input/output pad PAD1, and may transfer parallel-arranged data DATA1 through the plurality of first data lines L1.

A first data output circuit OUT_CIR1 may communicate with the first cell array 210 and the first data input/output pad PAD1, and may serially arrange and output data DATA1, outputted from the first cell array 210, to the first data input/output pad PAD1, during a data output operation. The first data output circuit OUT_CIR1 may latch and parallel-to-serial convert data DATA1, transferred in parallel through the plurality of first data lines L1, and output the serially-arranged data DATA1 to the first data input/output pad PAD1 at a time point at which a predetermined time period has elapsed from an application of a read command RD.

The second cell array 220 may include first to $M^{th}$ sub-cell arrays SUB1 to SUBM, each of which may include a plurality of memory cells CELL. Here, the first to $M^{th}$ sub-cell arrays SUB1 to SUBM may correspond to banks that are identified by a bank address BK_ADD included in the address ADD. Therefore, between the first to $M^{th}$ sub-cell arrays SUB1 to SUBM of the first cell array 210 and the first to $M^{th}$ sub-cell arrays SUB1 to SUBM of the second cell array 220, mutually corresponding sub-cell arrays may be sub-cell arrays included in the same bank. For example, the first sub-cell array SUB1 of the first cell array 210 and the first sub-cell array SUB1 of the second cell array 220 may be included in a first bank. The plurality of memory cells CELL included in the second cell array 220 are coupled to the plurality of word lines WL and the plurality of bit lines BL.

The second row control unit 221 may activate one or more word lines WL, from among the plurality of word lines WL, that correspond to an address ADD, in response to an active command ACT. The second column control unit 222 may generate, in response to a write command WT or a read command RD, a second selection signal YI2 to select one or more bit lines BL corresponding to the address ADD, and may transfer data DATA2 between a plurality of second data lines L2 and one or more bit lines BL selected by the second selection signal YI2.

A second data input circuit IN_CIR2 may communicate with the second cell array 220 and the second data input/output pad PAD2, and may parallel-arrange and input data DATA2, inputted from the second data input/output pad PAD2, to the second cell array 220, during a data input operation. The second data input circuit IN_CIR2 may serial-to-parallel convert data DATA2, inputted in series through the second data input/output pad PAD2, and may transfer parallel-arranged data DATA2 through the plurality of second data lines L2.

The second data output circuit OUT_CIR2 may communicate with the second cell array 220 and the second data input/output pad PAD2, and may serially arrange and output data DATA2, outputted from the second cell array 220, to the second data input/output pad PAD2, during a data output operation. The second data output circuit OUT_CIR2 may latch and serial-to-parallel convert data DATA2, transferred in parallel through the plurality of second data lines L2, and may output the serially-arranged data DATA2 to the second data input/output pad PAD2, at a time point at which a predetermined time period has elapsed from application of a read command RD.

As described above, the first to $M^{th}$ sub-cell arrays SUB1 to SUBM of the first cell array 210 and the first to $M^{th}$ sub-cell arrays SUB1 to SUBM of the second cell array 220 correspond to first to $M^{th}$ banks, respectively. Therefore, by a bank address BK_ADD included in an address ADD, one sub-cell array is selected from among the first to $M^{th}$ sub-cell arrays SUB1 to SUBM of the first cell array 210, while the first to $M^{th}$ sub-cell arrays SUB1 to SUBM of the second cell array 220 are selected.

The overall operation of the exemplary memory will be described with respect to the aforementioned exemplary configuration.

(1) Data Input Operation

If an active command ACT and an address ADD are applied to the memory, then a sub-cell array, corresponding to a bank address BK_ADD, may be selected from among the first to $M^{th}$ sub-cell arrays SUB1 to SUBM. The first row control unit 211 may activate a word line WL, selected from among the plurality of word lines WL, of the first cell array 210. The second row control unit 221 may activate a word line WL, selected from among the plurality of word lines WL, of the second cell array 220.

Next, if a write command WT and an address ADD are applied to the memory, the first column control unit 212 may generate a first selection signal YI1 to select one or more bit lines, from among the plurality of bit lines of the first cell array 210, corresponding to the address ADD. The second column control unit 222 may generate a second selection signal YI2 to select one or more bit lines, from among the plurality of bit lines of the second cell array 220, corresponding to the address ADD.

The first data input circuit IN_CIR1 may parallel-arrange and load data DATA1, which is input in series through one or more first data input/output pads PAD1, on the plurality of first data lines L1. The second data input circuit IN_CIR2 may parallel-arrange and load data DATA2, which is input in series through one or more second data input/output pads PAD2, on the plurality of second data lines L2.

The first column control unit 212 may transfer data DATA1, of the plurality of first data lines L1, to one or more bit lines BL selected by the first selection signal YI1. The second column control unit 222 may transfer data DATA2, of the plurality of second data lines L2, to one or more bit lines BL selected by the second selection signal YI2. In the first cell array 210 and second cell array 220, data DATA1 and data DATA2, transferred through bit lines BL, are stored in memory cells CELL, which are coupled by activated word lines WL and selected bit lines BL.

(2) Data Output Operation

If an active command ACT and an address ADD are applied to the memory, then a sub-cell array, corresponding to a bank address BK_ADD, may be selected from among the first to $M^{th}$ sub-cell arrays SUB1 to SUBM. The first row control unit 211 may activate a word line WL, selected from among the plurality of word lines WL of the first cell array 210. The second row control unit 221 may activate a word line WL, selected from among the plurality of word lines WL of the second cell array 220.

Next, if a read command RD an address ADD are applied to the memory, the first column control unit 212 may generate a first selection signal YI1 to select one or more bit lines, from among the plurality of bit lines of the first cell array 210, corresponding to the address ADD. The second column control unit 222 may generate a second selection signal YI2 to select one or more bit lines, from among the plurality of bit lines of the second cell array 220, corresponding to the address ADD.

The first column control unit 212 may transfer data DATA1, of one or more bit lines BL selected by the first selection signal YI1, to the plurality of first data lines L1. The second column control unit 222 may transfer data DATA2, of one or more bit lines BL selected by the second selection signal YI2, to the plurality of second data lines L2.

The first data output circuit OUT_CIR1 may serially arrange parallel data DATA1 transferred through the plurality of first data lines L1, and may output the serially-arranged data DATA1 to one or more first data input/output pads PAD1, after a predetermined time period has elapsed from an application time point of the read command RD. The second data output circuit OUT_CIR2 may serially arrange parallel data DATA2 transferred through the plurality of second data lines L2, and may output the serially-arranged data DATA2 to one or more second data input/output pads PAD2, after a predetermined time period has elapsed from an application time point of the read command RD.

For reference, if a bit line BL is selected in a state in which a word line WL is activated, then memory cells to/from which data is to be inputted/outputted are selected. Therefore, in this case, selection signals YI1 and YI2 can be regarded as information to select bit lines BL, and as information to select memory cells to/from which data is to be inputted/outputted from among a plurality of memory cells CELL.

In FIG. 2, data inputted to/outputted from each data input/output pad is inputted to/outputted from one sub-cell array selected from among the first to $M^{th}$ sub-cell arrays SUB1 to SUBM of the first cell array 210 and second cell array 220.

Although FIG. 2 illustrates an example where the first cell array 210 and second cell array 220 are disposed in upper and lower portions, respectively, and the data input/output pads PAD1 and PAD2 and the data input/output circuits IN_CIR1, IN_CIR2, OUT_CIR1, and OUT_CIR2 are disposed between the first cell array 210 and the second cell array 220, the first cell array 210 and the second cell array 220 may be disposed in left and right portions, and the positions of the other components may also be varied. In such an exemplary arrangement, the selection signals YI1 and YI2 may be column selection signals to select a column to be accessed in the cell arrays.

In the exemplary memory, each data input/output pad to input/output data to/from each cell array is disposed adjacent to the cell array corresponding to the data input/output pad, so that it is possible to reduce a length and loading of data lines. Each address allows a sub-cell array, corresponding to the address, to be selected from each cell array, and a selection signal allows memory cells, to/from which data is inputted/outputted through each data input/output pad is inputted/outputted, to be selected.

Figure 3:
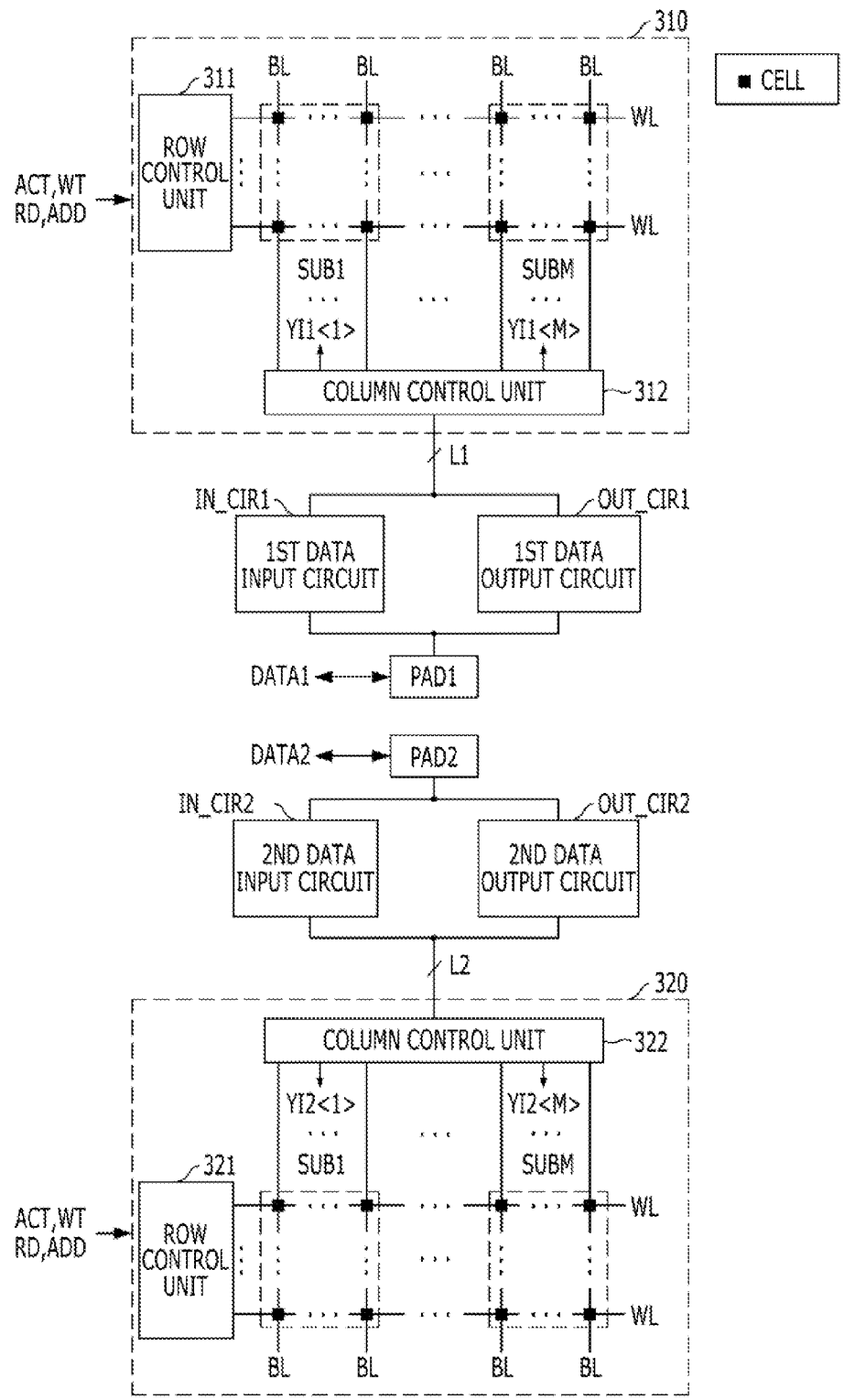
FIG. 3 is a view illustrating the configuration of a memory according to anther implementation of the present invention.

FIG. 3 is a view illustrating the configuration of an exemplary memory.

In FIG. 3, a first cell array 310 may generate, in response to an address ADD, and a command WT or a command RD, accompanied with input/output of data, M number of first selection signals YI1<1>-YI1≤M> that respectively correspond to first to $M^{th}$ sub-cell arrays SUB1 to SUBM of the first cell array 310. During a data input/output operation, the first cell array 310 may input/output, through one or more first data input/output pads PAD1, data DATA1 that is inputted to/outputted from memory cells, from among the plurality of memory cells of the first to $M^{th}$ sub-cell arrays SUB1 to SUBM of the first cell array 310, selected by the M number of first selection signals YI1<1>-YI1≤M>.

In addition, a second cell array 320 may generate, in response to an address ADD, and a command WT or a command RD, accompanied with input/output of data, M number of second selection signals YI2<1>-YI2<M> that respectively correspond to first to $M^{th}$ sub-cell arrays SUB1 to SUBM of the second cell array 320. During a data input/output operation, the second cell array 320 may input/output, through one or more second data input/output pads PAD2, data DATA2 that is inputted to/outputted from memory cells, from among the plurality of memory cells of the first to $M^{th}$ sub-cell arrays SUB1 to SUBM of the second cell array 320, selected by the M number of second selection signals YI2<1>-YI2<M>.

The memory of FIG. 3 may select one bit line BL, in each of the first to $M^{th}$ sub-cell arrays SUB1 to SUBM of the first cell array 310 and second cell array 320 (i.e. one memory cell every sub-cell array), in response to an address ADD, and inputs/outputs data. Therefore, a selection signal may be generated according to each sub-cell array, and data may be inputted to/outputted from a memory cell selected from each sub-cell array, in response to each selection signal.

Figure 4:
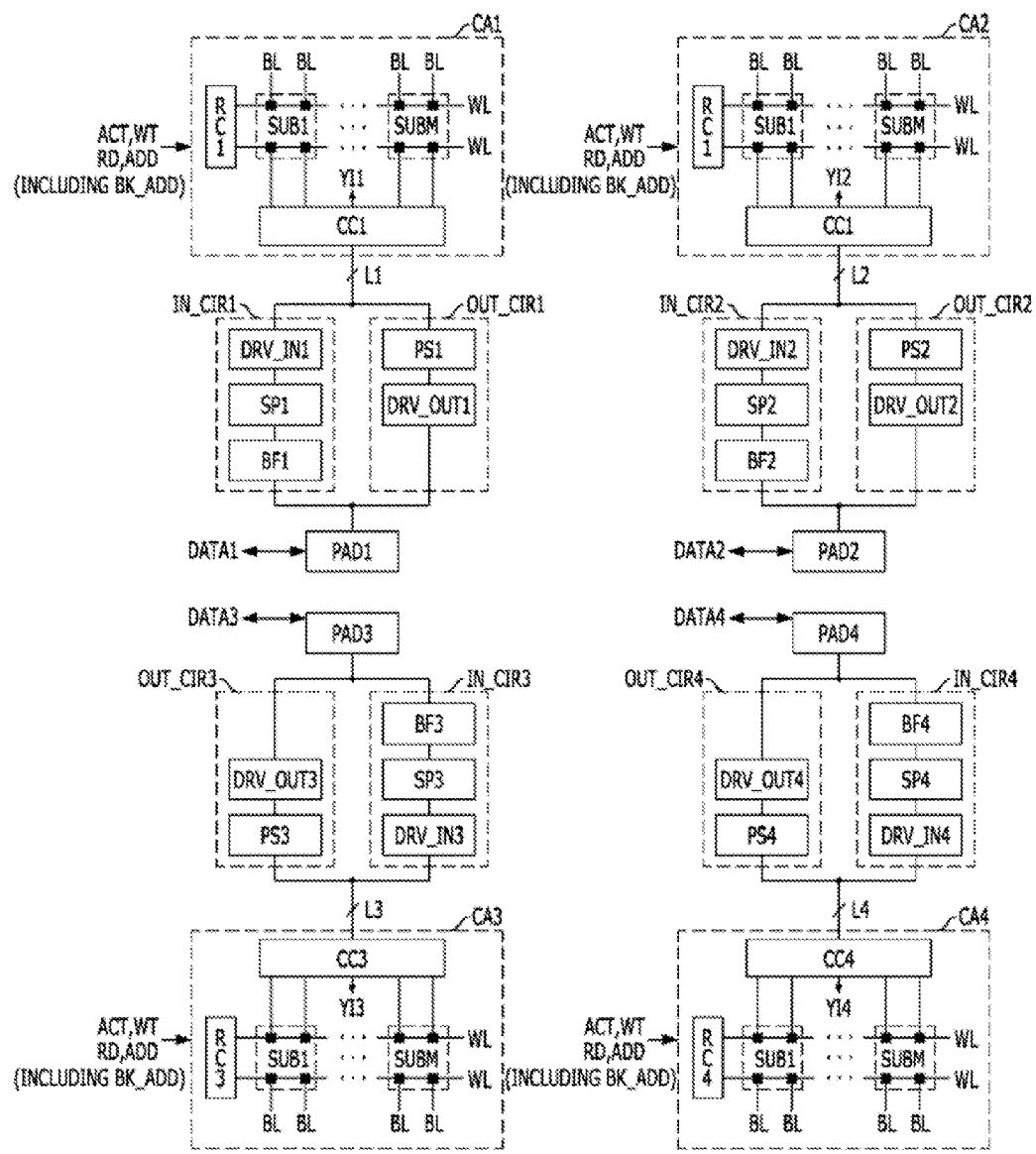
FIG. 4 is a view illustrating the configuration of a memory according to another implementation of the present invention.

FIG. 4 is a view illustrating the configuration of an exemplary memory.

As illustrated in FIG. 4, a memory may include first to $N^{th}$ cell arrays CA1 to CA4 that each include a plurality of memory cells. The memory may further include one or more first to $N^{th}$ data input/output pads PAD1 to PAD4 that respectively correspond to the first to $N^{th}$ cell arrays CA1 to CA4. Each data input/output pad, of the one or more first to $N^{th}$ data input/output pads PAD1 to PAD4, may input/output data of a corresponding cell array. In addition, the first to $N^{th}$ cell arrays CA1 to CA4 may include first to $N^{th}$ row/column control units RC1-RC4 and CC1-CC4 to control data input/output of a plurality of memory cells CELL in response to commands ACT, WT, or RD, and an address ADD. The one or more first to $N^{th}$ data input/output pads PAD1 to PAD4 may be disposed adjacent to cell arrays, among the first to $N^{th}$ cell arrays CA1 to CA4, that correspond to the respective data input/output pads. FIG. 4 illustrates an example where the is a single one of each of the first to $N^{th}$ data input/output pads PAD1 to PAD4. Although FIG. 4 illustrates the case of "N=4", the value of "N" can vary depending on designs.

The address ADD may include a row address to select one or more word lines, from among a plurality of word lines WL, and a column address to select one or more bit lines from among a plurality of bit lines BL.

The operation of the exemplary memory of FIG. 4 will be described below.

If a write command WT is received by the memory, the memory may write data DATA1 to DATA4, which are inputted through the data input/output pads PAD1 to PAD4, in memory cells selected by an address ADD. If a read command RD is received by the memory, the memory may output, to the data input/output pads PAD1 to PAD4, data of memory cells selected by an address ADD. Generally, the write command WT and the read command RD are inputted after an active command ACT is inputted to activate the word lines WL.

A $K^{th}$ cell array CAK (1≤K≤M) may include first to $M^{th}$ sub-cell arrays SUB1 to SUBM that may include a plurality of memory cells CELL. Here, the first to $M^{th}$ sub-cell arrays SUB1 to SUBM may correspond to banks that are distinguished by a bank address BK_ADD, included in the address ADD. The plurality of memory cells CELL included in the $K^{th}$ cell array CAK are in communication with a plurality of word lines WL and a plurality of bit lines BL.

A $K^{th}$ row control unit RCK may activate one or more word lines WL, from among the plurality of word lines WL, which corresponds to an address ADD, in response to an active command ACT. A $K^{th}$ column control unit CCK may generate a $K^{th}$ selection signal YIK to select one or more bit lines BL, corresponding to the address ADD, in response to a write command WT or a read command RD, and may transfer data DATAK between a plurality of $K^{th}$ data lines LK and a bit line BL selected by the $K^{th}$ selection signal YIK.

A $K^{th}$ data input circuit IN_CIRK may communicate with a $K^{th}$ cell array CAK and a $K^{th}$ data input/output pad PADK, and may parallel-arrange and input data DATAK inputted from the $K^{th}$ data input/output pad PADK to the $K^{th}$ cell array CAK, during a data input operation. The $K^{th}$ data input circuit IN_CIRK may serial-to-parallel convert data DATAK, inputted in series through the $K^{th}$ data input/output pad PADK, and may transfer parallel-arranged data DATAK through the plurality of $K^{th}$ data lines LK.

The first to $N^{th}$ data input circuits IN_CIR1 to IN_CIR4 may include buffering units BF1 to BF4 to buffer data inputted through corresponding first to $N^{th}$ data input/output pads PAD1 to PAD4. The first to $N^{th}$ data input circuits IN_CIR1 to IN_CIR4 may further include serial-to-parallel conversion units SP1 to SP4 to serial-to-parallel convert data buffered by respective ones of the buffering units BF1 to BF4. The first to $N^{th}$ data input circuits IN_CIR1 to IN_CIR4 may further include input drivers DRV_IN1 to DRV_IN4 to drive corresponding data lines, from among a plurality of first to $N^{th}$ data lines L1 to L4, in response to the data converted in parallel by respective ones of the serial-to-parallel conversion units SP1 to SP4.

The $K^{th}$ data output circuit OUT_CIRK corresponds to a $K^{th}$ cell array CAK and a $K^{th}$ data input/output pad PADK, and may serially arrange and output data DATAK, outputted through the $K^{th}$ cell array CAK, to the $K^{th}$ data input/output pad PADK, during a data output operation. The $K^{th}$ data output circuit OUT_CIRK may latch and parallel-to-serial convert data DATAK, transferred in parallel through a plurality of $K^{th}$ data lines LK, and may output the serially-arranged data DATAK to the $K^{th}$ data input/output pad PADK, at a time point at which a predetermined time period has elapsed from application of a read command RD.

The first to $N^{th}$ data output circuits OUT_CIR1 to OUT_CIR4, may include parallel-to-serial conversion units PS1 to PS4 to parallel-to-serial convert and output data received through corresponding data lines, from among a plurality of the first to $N^{th}$ data lines L1 to L4, corresponding to the parallel-to-serial conversion units. The first to $N^{th}$ data output circuits OUT_CIR1 to OUT_CIR4 may further include output drivers DRV_OUT1 to DRV_OUT4 to drive corresponding ones of the data input/output pads PAD1 to PAD4, in response to data converted in series by the parallel-to-serial conversion units PS1 to PS4.

As described above, since the first to $M^{th}$ sub-cell arrays SUB1 to SUBM, of the first to $N^{th}$ cell array CA1 to CA4, respectively correspond to first to $M^{th}$ banks, one sub-cell array may be selected from each of the first to $N^{th}$ cell array CA1 to CA4 using a bank address BK_ADD included in an address ADD.

During a data input/output operation, the $K^{th}$ cell array CAK, the $K^{th}$ data input/output circuits IN_CIRK and OUT_CIRK, and the $K^{th}$ data input/output pad PADK may perform the same respective operations as the first cell array 210, the first data input/output circuits IN_CIR1 and OUT_CIR1, and the first data input/output pad PAD1, as described above with reference to FIG. 2.

FIG. 4 illustrates an example case where each of row control units RC1 to RC4 may be included according to each cell array. Alternatively, the first to $N^{th}$ cell arrays CA1 to CA4 may share a row control unit.

In the exemplary memory, each data input/output pad of each cell array may be disposed adjacent to the cell array corresponding to the data input/output pad, so that it is possible to reduce the length and loading of data lines. Each address allows a sub-cell array corresponding to the address to be selected from each cell array, and a selection signal allows memory cells, to/from which data inputted/outputted through each data input/output pad is inputted/outputted, to be selected.

Figure 5:
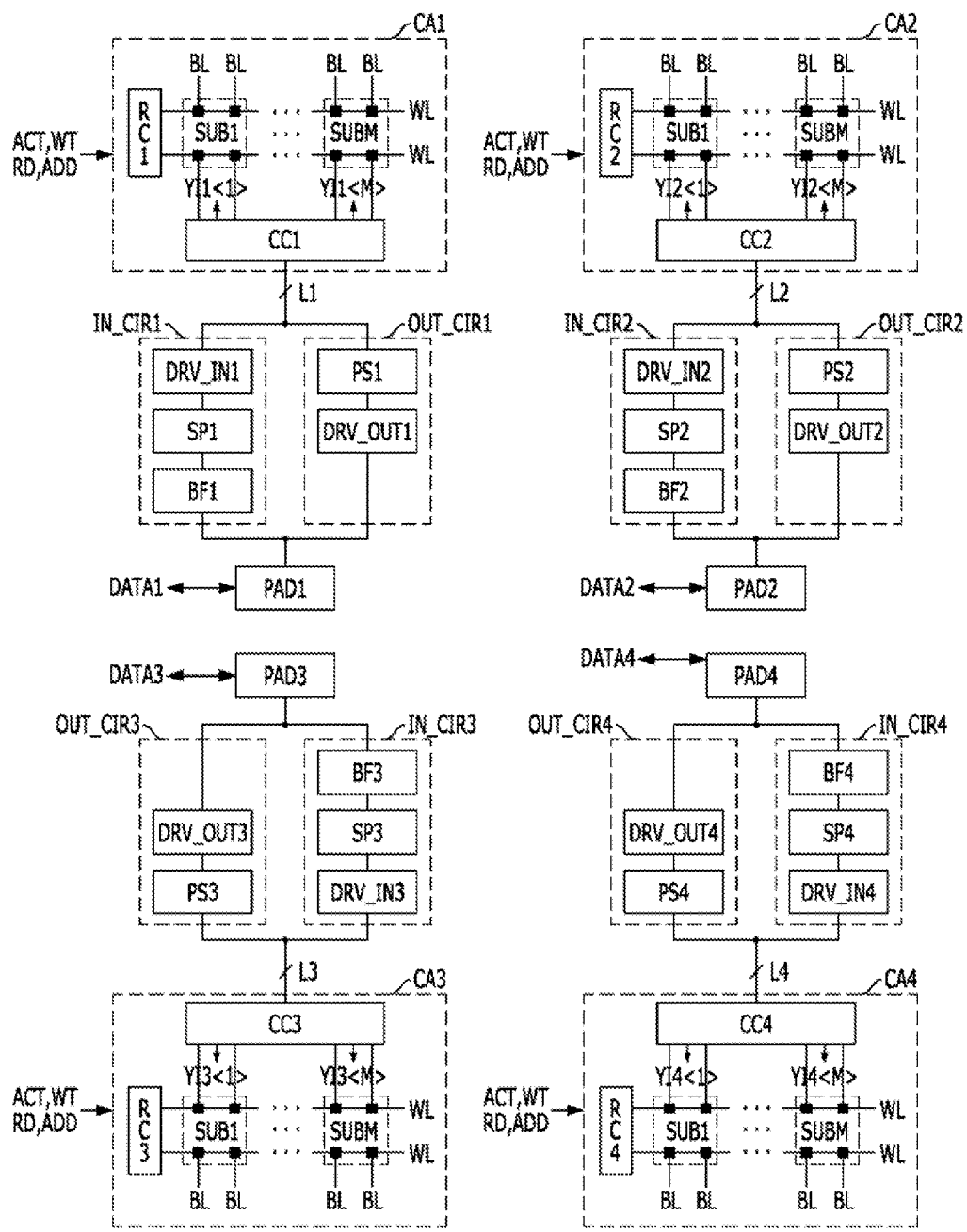
FIG. 5 is a view illustrating the configuration of a memory according to another implementation of the present invention.

FIG. 5 is a view illustrating a configuration of an exemplary memory. The operation of the memory shown in FIG. 5 will be described below.

In FIG. 5, a $K^{th}$ cell array CAK may generate, in response to an address ADD, and a command WT or a command RD, accompanied with input/output of data, M number of $K^{th}$ selection signals YIK<1>-YIK<M> corresponding to respective first to $M^{th}$ sub-cell arrays SUB1 to SUBM of the $K^{th}$ cell array CAK. During a data input/output operation, the $K^{th}$ cell array CAK may input/output, through one or more $K^{th}$ data input/output pads PADK, data DATAK, which is inputted to/outputted from memory cells, from among the plurality of memory cells of the first to $M^{th}$ sub-cell arrays SUB1 to SUBM of the $K^{th}$ cell array CAK, selected by the M number of $K^{th}$ selection signals YIK<1>-YIK<M>.

The memory of FIG. 5 may select one bit line BL in each of the first to $M^{th}$ sub-cell arrays SUB1 to SUBM, of the first to $N^{th}$ cell arrays CA1 to CA4 (i.e. one memory cell every sub-cell array), in response to an address ADD, and may input/output data. Therefore, a selection signal may be is generated according to each sub-cell array, and data may be inputted to/outputted from a memory cell selected from each sub-cell array, in response to each selection signal. The other operations are the same as that of the memory shown in FIG. 4.

Figure 6:
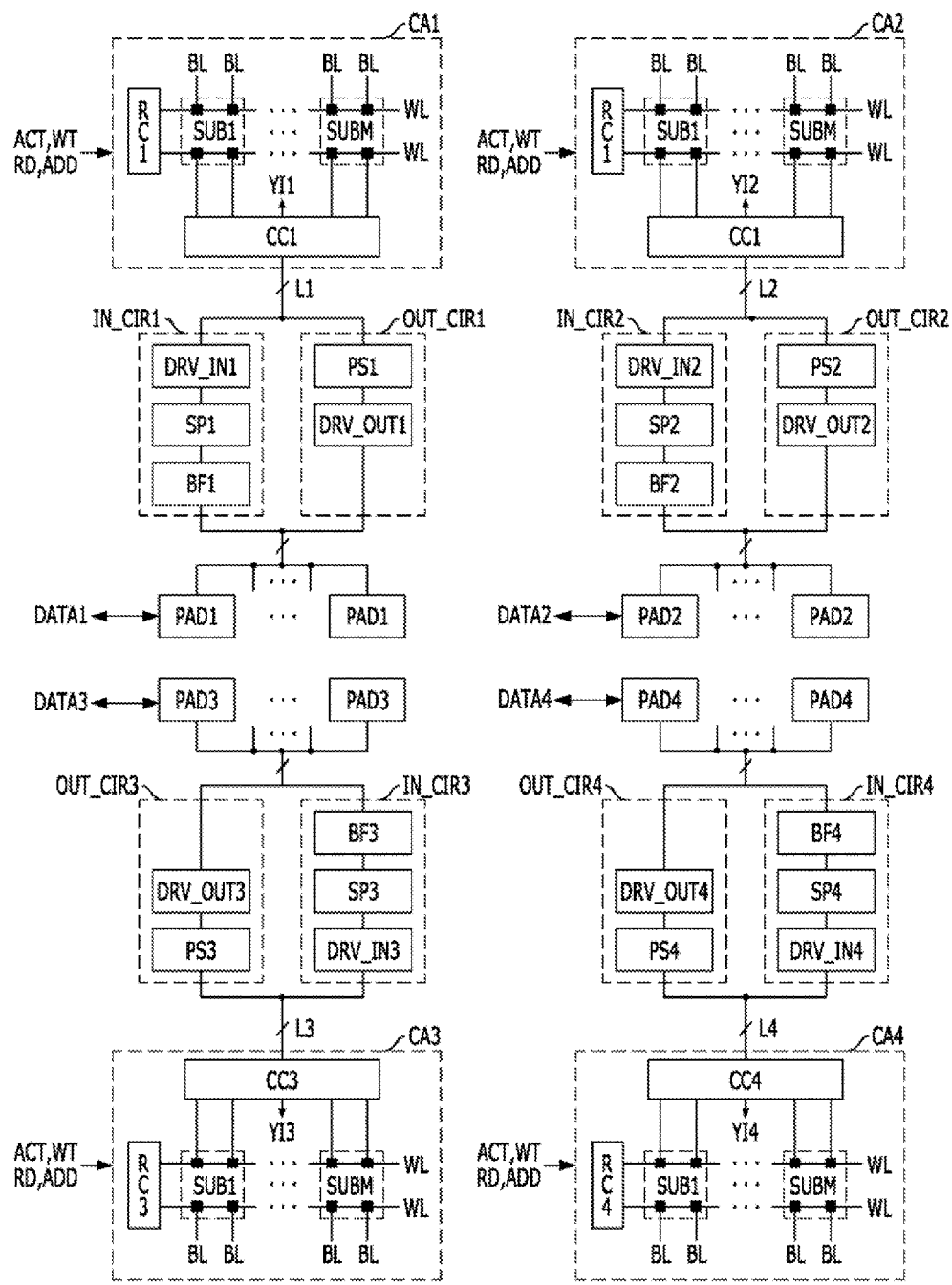
FIG. 6 is a view illustrating the configuration of a memory according to another implementation of the present invention.

FIG. 6 is a view illustrating a configuration of an exemplary memory.

In the memory shown in FIG. 6, a plurality of data input/output pads to input/output PAD1 to PAD4 correspond to respective ones of first to $N^{th}$ cell arrays CA1 to CA4.

The memory of FIG. 6 may perform the same operations as the memory of FIG. 4. In the exemplary memory of FIG. 6, a $K^{th}$ data input circuit IN-CIRK may parallel-arrange data DATAK inputted in series through a plurality of $K^{th}$ data input/output pads PADK corresponding to the $K^{th}$ data input circuit, and may transfer the parallel-arranged data through a plurality of data lines LK corresponding to the $K^{th}$ data input circuit. A $K^{th}$ data output circuit OUT-CIRK parallel-to-serial may convert data DATAK received through a plurality of data lines LK so as to serially output the data to each of a plurality of $K^{th}$ data input/output pads PADK.

Figure 7:
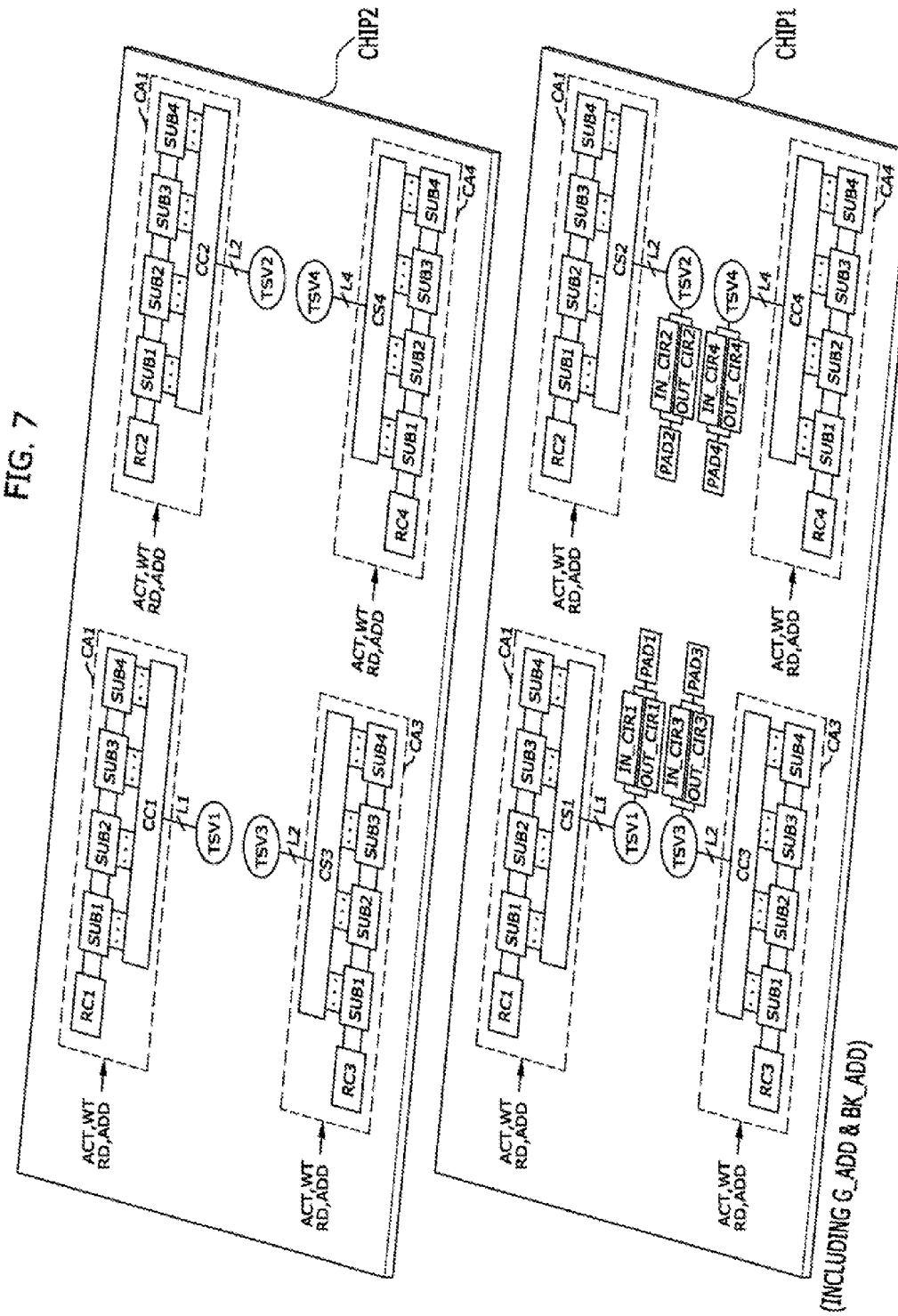
FIG. 7 is a view illustrating the configuration of a memory system according to another implementation of the present invention.

FIG. 7 is a view illustrating an exemplary configuration of a memory system n.

As illustrated in FIG. 7, a memory system may include a first memory chip CHIP1, which may include first to $N^{th}$ cell arrays CA1 to CA4, each including a plurality of memory cells (not shown in FIG. 7). The memory system may further include a second memory chip CHIP2, which may include first to $N^{th}$ cell arrays CA1 to CA4, each including a plurality of memory cells. The second memory chip CHIP2 may be stacked on the first memory chip CHIP1. The memory system may further include one or more first to $N^{th}$ data input/output pads PAD1 to PAD4 that may input/output data of cell arrays, from among the first to $N^{th}$ cell arrays CA1 to CA4 of the first memory chip CHIP1 and the first to $N^{th}$ cell arrays CA1 to CA4 of the second memory chip CHIP2, corresponding to respective ones of the one or more first to $N^{th}$ data input/output pads PAD1 to. In FIG. 7, the internal configurations of sub-cell arrays SUB1 to SUB4 are briefly shown. The internal configurations of sub-cell arrays SUB1 to SUB4 in FIG. 7 are the same or similar to those of the sub-cell arrays SUB1 to SUB4, as shown in FIG. 4. The first memory chip CHIP1 may be the same or similar to the memory shown in FIG. 4. The second memory chip CHIP2 may be the same or similar to the memory of FIG. 4, except that data input/output circuits IN_CIR1/OUT_CIR1 to IN_CIR4/OUT_CIR4 and data input/output pads PAD1 to PAD4 are not included.

The memory system of FIG. 7 may further include first to $N^{th}$ data output circuits OUT_CIR1 to OUT_CIR4, which respectively correspond to the first to $N^{th}$ cell arrays CA1 to CA4 of the first memory chip CHIP1 and the first to $N^{th}$ cell arrays CA1 to CA4 of the second memory chip CHIP2, and respectively correspond to first to $N^{th}$ data input/output pads PAD1 to PAD4. During a data output operation, serially-arrange data, received from cell arrays, from among the first to $N^{th}$ cell arrays CA1 to CA4 of the first memory chip CHIP1 and from among the first to $N^{th}$ cell arrays CA1 to CA4 of the second memory chip CHIP2, corresponding to the respective data output circuits is output to data input/output pads PAD1 to PAD4 corresponding to the respective data output circuits from among the first to $N^{th}$ data input/output pads PAD1 to PAD4. First to $N^{th}$ data input circuits IN_CIR1 to IN_CIR4, which respectively correspond to the first to $N^{th}$ cell arrays CA1 to CA4 of the first memory chip CHIP1 and the first to $N^{th}$ cell arrays CA1 to CA4 of the second memory chip CHIP2, respectively correspond to first to $N^{th}$ data input/output pads PAD1 to PAD4. During a data input operation, parallel-arrange data, inputted through data input/output pads PAD1 to PAD4, from among the first to $N^{th}$ data input/output pads PAD1 to PAD4, corresponding to the respective data input circuits is input to cell arrays, from among the first to $N^{th}$ cell arrays CA1 to CA4 of the first memory chip CHIP1 and from among the first to $N^{th}$ cell arrays CA1 to CA4 of the second memory chip CHIP2, corresponding to the respective data input circuits. The detailed configurations of the data input circuits and data output circuits are the same or similar to those shown in FIG. 4.

In addition, the first to $N^{th}$ cell arrays CA1 to CA4 of the first memory chip CHIP1 and second memory chip CHIP2 in the memory may include first to $N^{th}$ row/column control units RC1-RC4 and CC1-CC4 to control data input/output of a plurality of memory cells CELL in response to commands ACT, WT, or RD, and an address ADD.

The first to $N^{th}$ data input/output pads PAD1 to PAD4 may be included in the first memory chip CHIP1 and may be disposed adjacent to cell arrays, from among the first to $N^{th}$ cell arrays CA1 to CA4 of the first memory chip CHIP1, respectively corresponding to the data input/output pads.

The operation of the exemplary memory system will be described with reference to FIG. 7.

In the memory system of FIG. 7, the first memory chip CHIP1 may be a master chip that controls an interface for data input/output in the memory system. The second memory chip CHIP2 may be a slave ship to input/output data inputted to/outputted from the first memory chip CHIP1.

A $K^{th}$ cell array CAK ($1 \leq K \leq M$), of the first to $N^{th}$ cell arrays CA1 to CA4 of the first memory chip CHIP1, and a $K^h$ cell array CAK, of the first to $N^{th}$ cell arrays CA1 to CA4, of the second memory chip CHIP2 are in the same in relative positions in the first memory chip CHIP1 and second memory chip CHIP2. The first to $N^{th}$ cell arrays CA1 to CA4, of the second memory chip CHIP2, are coupled, via through vias TSV1 to TSV4, to data input/output pads, from among one or more first to $N^{th}$ data input/output pads PAD1 to PAD4, respectively corresponding to the cell arrays. The through vias TSV1 to TSV4 may be through silicon vias.

Each of the first to $N^{th}$ cell arrays CA1 to CA4 of the first memory chip CHIP1 may include first to $M^{th}$ sub-cell arrays SUB1 to SUB4 including a plurality of memory cells CELL, and each of the first to $N^{th}$ cell arrays CA1 to CA4 of the second memory chip CHIP2 may include first to $M^{th}$ sub-cell arrays SUB1 to SUB4 including a plurality of memory cells CELL. Although FIG. 7 illustrates the case of "M=4", the number of sub-cell arrays included in each cell array can vary depending on designs.

The first to $M^{th}$ sub-cell arrays SUB1 to SUB4, of the first to $N^{th}$ cell arrays CA1 to CA4 of the first memory chip CHIP1, and the first to $M^h$ sub-cell arrays SUB1 to SUB4, of the first to $N^{th}$ cell arrays CA1 to CA4 of the second memory chip CHIP2, may correspond to first to $M^{th}$ banks that are identified by a bank address BK_ADD. The memory system may operate according to cell array groups included in a plurality of banks. To this end, an address ADD can include a group address G_ADD to identify cell array groups from each other.

A first group may include first to $L^{th}$ sub-cell arrays SUB1 and SUB2 ($1 \leq L \leq M$), from among the first to $M^{th}$ sub-cell arrays SUB1 to SUB4 of the first to $N^{th}$ cell arrays CA1 to CA4 of the first memory chip CHIP1, and from among $(L+1)^{th}$ to $M^{th}$ sub-cell arrays SUB3 and SUB4 ($1 \leq L \leq M$), from among the first to $M^{th}$ sub-cell arrays SUB1 to SUB4 of the first to $N^{th}$ cell arrays CA1 to CA4 of the second memory chip CHIP2. A second group may include $(L+1)^{th}$ to $M^{th}$ sub-cell arrays SUB3 and SUB4 ($1 \leq L \leq M$), from among the first to $M^h$ sub-cell arrays SUB1 to SUB4 of the first to $N^{th}$ cell arrays CA1 to CA4 of the first memory chip CHIP1, and from among first to $L^h$ sub-cell arrays SUB1 and SUB2 ($1 \leq L \leq M$), from among the first to $M^{th}$ sub-cell arrays SUB1 to SUB4 of the first to $N^{th}$ cell arrays CA1 to CA4 of the second memory chip CHIP2.

During a data input/output operation of the first group, in response to a command WT, or a command RD, and accompanied with input/output data, and an address ADD including a bank address BK_ADD, data may be inputted to/outputted from selected memory cells CELL of a sub-cell array that may be selected from among the first to $L^h$ sub-cell arrays SUB1 and SUB2 of the first memory chip CHIP1 and from among the $(L+1)^{th}$ to $M^{th}$ sub-cell arrays SUB3 and SUB4 of the second memory chip CHIP2 (wherein the first group is selected by a group address G_ADD). During a data input/output operation of the second group, in response to a command WT or a command RD accompanied with input/output of data, and an address ADD including an address ADD, data may be inputted to/outputted from selected memory cells CELL of a sub-cell array that may be selected from among the first to $L^h$ sub-cell arrays SUB1 and SUB2 of the second memory chip CHIP2 and from among the $(L+1)^{th}$ to $M^{th}$ sub-cell arrays SUB3 and SUB4 of the first memory chip CHIP1 (wherein the second group is selected by a group address G_ADD).

A KM data input circuit IN_CIRK corresponds to the $K^{th}$ cell array CAK of the first memory chip CHIP1 and the second memory chip CHIP2, and one or more $K^{th}$ data input/output pads PADK. During a data input operation, $K^{th}$ data input circuit IN_CIRK may parallel-arrange and input data, inputted through the one or more $K^{th}$ data input/output pads PADK, to the $K^{th}$ cell array CAK. In response to a write command WT, the $K^{th}$ data input circuit IN_CIRK serial-to-parallel may convert data inputted in series through the one or more $K^{th}$ data input/output pads PADK, and may transfer the parallel-converted data through a plurality of $K^{th}$ data lines LK of the first memory chip CHIP1 or through a plurality of $K^{th}$ data lines LK of the second memory chip CHIP2.

A $K^{th}$ data output circuit OUT_CIRK corresponds to the $K^{th}$ cell array CAK of the first memory chip CHIP1 and the second memory chip CHIP2, and one or more $K^{th}$ data input/output pads PADK. During a data output operation, the A $K^{th}$ data output circuit OUT_CIRK may serially-arrange and output data outputted from the $K^{th}$ cell array CAK to the one or more $K^{th}$ data input/output pads PADK. The $K^{th}$ data output circuit OUT_CIRK may latch and parallel-to-serial convert data transferred in parallel through the plurality of $K^{th}$ data lines LK of the first memory chip CHIP1 or the plurality of $K^{th}$ data lines LK of the second memory chip CHIP2, and may output the serially-converted data to the one or more $K^{th}$ data input/output pads PADK, at a time point at which a predetermined time period has elapsed from application of a read command RD.

The operation of activating word lines in each cell array, and the operation of generating a selection signal and selecting memory cells to/from which data is to be inputted/outputted are the same as or similar to those described with reference to FIG. 4.

If an active command ACT and an address ADD are applied to the memory, one bank, of a plurality of banks in a group selected from the first group or the second group is selected, and data is inputted to/outputted from the selected bank. Here, in the case of the first group, a first sub-cell array SUB1 and a second sub-cell array SUB2, of the first to $N^{th}$ cell arrays CA1 to CA4 of the first memory chip CHIP1, may correspond to a first bank and a second bank, respectively, and a third sub-cell array SUB3 and a fourth sub-cell array SUB4 of the first to $N^{th}$ cell arrays CA1 to CA4 of the second memory chip CHIP2 may correspond to a third band and a fourth bank, respectively. In addition, in the case of the second group, a first sub-cell array SUB1 and a second sub-cell array SUB2 of the first to $N^{th}$ cell arrays CA1 to CA4 of the second memory chip CHIP2 may correspond to a first bank and a second bank, respectively, and a third sub-cell array SUB3 and a fourth sub-cell array SUB4 of the first to $N^{th}$ cell arrays CA1 to CA4 of the first memory chip CHIP1 correspond to a third band and a fourth bank, respectively. The operation of inputting/outputting data to/from a bank selected from among the banks is the same as or similar to that described with reference to FIG. 4.

For reference, for convenience of illustration, through vias TSV1 to TSV4 are illustrated in each of the first memory chip CHIP1 and second memory chip CHIP2, wherein the through vias TSV1 to TSV4 shown in the first memory chip CHIP1 are connected to the through vias TSV1 to TSV4 shown in the second memory chip CHIP2, respectively.

The sub-cell arrays, i.e. the banks, are allocated respective bank addresses BK_ADD, having different values. Therefore, in the exemplary memory system, when groups are distinguished using a group address G_ADD, a bank address BK_ADD may be applied and used in the same manner as in the case of using one memory chip. That is to say, it is possible to more easily select and control banks even on an operation according to cell array groups.

According to the present invention, each cell array is allocated one or more data input/output pads for taking charge of data input/output of the cell array, and each cell array and one or more data input/output pads for taking charge of data input/output of the cell array are disposed to be adjacent to each other, so that it is possible to reduce the length and loading of a global bus for transferring data between cell arrays and one or more data input/output pads.

In addition, according to the present invention, since sub-cell arrays included in cell arrays are divided according to banks, it is possible to smoothly achieve the operations of groups including a plurality of banks and to reduce skewness in a memory system in which memory chips are stacked.

Although various exemplary implementations have been described for illustrative purposes, it will be apparent to those skilled in the art that various changes and modifications may be made without departing from the spirit and scope of the invention as defined in the following claims.

What is claimed is:

1. A memory comprising:
   first to $N^{th}$ cell arrays configured to include a plurality of memory cells;
   one or more first to $N^{th}$ data input/output pads respectively corresponding to the first to $N^{th}$ cell arrays, wherein the one or more first to $N^{th}$ data input/output pads are configured to input/output data to/from the first to $N^{th}$ cell arrays, wherein the one or more first to $N^{th}$ data input/output pads are disposed adjacent to corresponding cell arrays from among the first to $N^{th}$ cell arrays;
   the first to $N^{th}$ data output units are configured to serially arrange data received from corresponding cell arrays of the first to $N^{th}$ cell arrays, and output the serially-arranged data to the corresponding first to $N^{th}$ data input/output pads; and
   the first to $N^{th}$ data input units are configured to parallel-arrange data inputted through the corresponding first to $N^{th}$ data input/output pads, and input the parallel-arranged data to the corresponding cell arrays, of the first to $N^{th}$ cell arrays.

2. The memory of claim 1, further comprising:
   a plurality of first to $N^{th}$ data lines respectively corresponding to the first and $N^{th}$ cell arrays, the first to $N^{th}$ data output units, and the first and $N^{th}$ data input units, wherein the plurality of first to $N^{th}$ data lines are configured to transfer data between the first to $N^{th}$ data output units and the respectively corresponding first to $N^{th}$ cell arrays, and transfer data between the first to $N^{th}$ data input units and the respectively corresponding first to $N^{th}$ cell arrays.

3. The memory of claim 2, wherein each of the first to $N^{th}$ data output units comprises:
   a parallel-to-serial conversion unit configured to parallel-to-serial convert and output data received through a plurality of data lines, from among the plurality of first to $N^{th}$ data lines, corresponding to the parallel-to-serial conversion unit; and
   an output driver configured to drive the one or more pads in response to data converted in series by the parallel-to-serial conversion unit.

4. The memory of claim 2, wherein each of the first to $N^{th}$ data input units comprises:
   a buffering unit configured to buffer data inputted through one or more data input/output pads, from among the one or more first to $N^{th}$ data input/output pads, corresponding to the buffering unit;
   a serial-to-parallel conversion unit configured to serial-to-parallel convert data buffered by the buffering unit; and
   an input driver configured to drive a plurality of data lines, among the plurality of first to $N^{th}$ data lines, corresponding to the input driver, in response to the data converted in parallel by the serial-to-parallel conversion unit.

5. The memory of claim 1, wherein a $K^{th}$ cell array ($1 \leq K \leq M$), of the first to $N^{th}$ cell arrays includes first to $M^{th}$ sub-cell arrays including a plurality of memory cells, and wherein the $K^{th}$ cell array is configured to:
   generate a $K^{th}$ selection signal in response to an address and a input/output data accompanying command; and
   input/output, through one or more $K^{th}$ data input/output pads, data that is inputted to/outputted from memory cells, which are selected by the $K^{th}$ selection signal, from among a plurality of memory cells of a sub-cell array, which is selected by address, from among the first to $M^{th}$ sub-cell arrays.

6. The memory of claim 5, wherein the first to $M^{th}$ sub-cell arrays of the first to $N^{th}$ cell arrays respectively correspond to first to $M^{th}$ banks of sub-cells, wherein each of the first to $M^{th}$ banks of sub-cells are identified by a respective bank address.

7. The memory of claim 1, wherein a $K^{th}$ cell array ($1 \leq K \leq M$) of the first to $N^{th}$ cell arrays includes first to $M^{th}$ sub-cell arrays including a plurality of memory cells, and wherein the $K^{th}$ cell array is configured to:
   generate M number of $K^{th}$ selection signals, respectively corresponding to the first to $M^{th}$ sub-cell arrays, in response to an address and a command accompanied with input/output of data; and
   input/output, through one or more $K^{th}$ data input/output pads, data that is inputted to/outputted from memory cells, which are selected by the M number of $K^{th}$ selection signals, from among a plurality of memory cells of the first to $M^{th}$ sub-cell arrays.

8. A memory comprising:
   a first cell array including a first plurality of memory cells;
   a second cell array including a second plurality of memory cells;
   one or more first data input/output pads respectively corresponding to the first cell array, wherein the one or more first data input/output pads are configured to input/output data to/from the first cell array, wherein the one or more first data input/output pads are disposed adjacent to the first cell array;
   one or more second data input/output pads respectively corresponding to the second cell array, wherein the one or more first data input/output pads are configured to input/output data to/from the second cell array, wherein the one or more second data input/output pads are disposed adjacent to the second cell array,
   a first data output unit corresponding to the first cell array and the one or more first data input/output pads, wherein the first data output unit configured to serially-arrange and output data received from the first cell array through the one or more first data input/output pads;
   a second data output unit corresponding to the second cell array and the one or more second data input/output pads, wherein the second data output unit configured to serially-arrange and output data received from the second cell array through the one or more second data input/ output pads;
   a first data input unit corresponding to the first cell array and the one or more first data input/output pads, wherein the first data output unit configured to parallel-arrange and input data inputted through the one or more first data input/output pads to the first cell array; and a second data input unit corresponding to the second cell array and the one or more second data input/output pads wherein the second data output unit configured to parallel-arrange and input data inputted through the one or more second data input/output pads to the second cell array.

9. The memory of claim 8, further comprising:
a plurality of first data lines corresponding to the first cell array, the first data output unit, and the first data input unit, wherein the first data lines are configured to transfer data between the first data output unit and the first cell array, and transfer data between the first data input unit and the first cell array; and
a plurality of second data lines corresponding to the second cell array, the second data output unit, and the second data input unit, wherein the second data lines are configured to transfer data between the second data output unit and the second cell array, and transfer data between the second data input unit and the second cell array.

10. The memory of claim 9, wherein each of the first and second data input units comprises:
a buffering unit configured to buffer data inputted through one or more data input/output pads, from among the one or more first and second data input/output pads, corresponding to the buffering unit;
a serial-to-parallel conversion unit configured to serial-to-parallel convert data buffered by the buffering unit; and
an input driver configured to drive a plurality of data lines, among the plurality of first and second data lines, corresponding to the input driver, in response to the data converted in parallel by the serial-to-parallel conversion unit.

11. The memory of claim 8, wherein
the first cell array includes first to $M^{th}$ sub-cell arrays, each including a plurality of memory cells, from among the first plurality of memory cells, wherein the first cell array is configured to:
generate a first selection signal in response to an address and a command accompanied with input/output of data; and
input/output, through the one or more first data input/output pads, data that is inputted to/outputted from memory cells, which are selected by the first selection signal, from among a plurality of memory cells of a sub-cell array, which is selected by the address, from among the first to $M^{th}$ sub-cell arrays of the first cell array, and
the second cell array includes first to $M^{th}$ sub-cell arrays, each including a plurality of memory cells, from among the second plurality of memory cells, wherein the second cell array is configured to:
generate a second selection signal in response to an address and a command accompanied with input/output of data; and
input/output, through the one or more second data input/output pads, data that is inputted to/outputted from memory cells, which are selected by the second selection signal, from among a plurality of memory cells of a sub-cell array, which is selected by the address, from among the first to $M^{th}$ sub-cell arrays of the second cell array.

12. The memory of claim 11, wherein the first to $M^{th}$ sub-cell arrays, of the first cell array, and the first to $M^{th}$ sub-cell arrays, of the second cell array, respectively correspond to first to $M^{th}$ banks of sub-cells, wherein each of the first to $M^{th}$ banks of sub-cells are identified by a respective bank address.

13. The memory of claim 8, wherein
the first cell array includes first to $M^{th}$ sub-cell arrays, each including a plurality of memory cells, from among the first plurality of memory cells, wherein the first cell array is configured to:
generate M number of first selection signals respectively corresponding to first to $M^{th}$ sub-cell arrays, of the first cell array, in response to an address and a command accompanied with input/output of data; and
input/output, through the one or more first data input/output pads, data that are inputted to/outputted from memory cells, which are selected by the M number of first selection signals, from among the plurality of memory cells of the first to $M^{th}$ sub-cell arrays of the first cell array, and
the second cell array includes first to $M^{th}$ sub-cell arrays including a plurality of memory cells, from among the second plurality of memory cells, wherein the second cell array is configured to:
generate M number of second selection signals respectively corresponding to first to $M^{th}$ sub-cell arrays, of the second cell array, in response to an address and a command accompanied with input/output of data; and
input/output, through the one or more second data input/output pads, data that are inputted to/outputted from memory cells, which are selected by the M number of first selection signals, from among the plurality of memory cells of the first to $M^{th}$ sub-cell arrays of the second cell array.

* * * * *